United States Patent
Kwon et al.

(10) Patent No.: US 10,564,224 B2
(45) Date of Patent: Feb. 18, 2020

(54) METHOD AND APPARATUS FOR ASSESSING LIFESPAN OF SECONDARY BATTERY

(71) Applicant: LG Chem, Ltd., Seoul (KR)

(72) Inventors: Ji-Yoon Kwon, Daejeon (KR); Young-Geun Choi, Daejeon (KR); Song-Taek Oh, Daejeon (KR)

(73) Assignee: LG Chem, Ltd., Seoul (KR)

(*) Notice: Subject to any disclaimer, the term of this patent is extended or adjusted under 35 U.S.C. 154(b) by 109 days.

(21) Appl. No.: 15/841,816

(22) Filed: Dec. 14, 2017

(65) Prior Publication Data
US 2018/0164384 A1  Jun. 14, 2018

(30) Foreign Application Priority Data
Dec. 14, 2016  (KR) .................. 10-2016-0170661

(51) Int. Cl.
*G01R 31/392* (2019.01)
*H01M 10/42* (2006.01)
*G01R 31/389* (2019.01)

(52) U.S. Cl.
CPC ......... *G01R 31/392* (2019.01); *G01R 31/389* (2019.01); *H01M 10/4285* (2013.01)

(58) Field of Classification Search
CPC .... G01R 31/392; G01R 31/389; G01R 31/36; G01R 19/10; H01M 10/4285; H01M 10/44
See application file for complete search history.

(56) References Cited

U.S. PATENT DOCUMENTS

| 2016/0161564 A1* | 6/2016 | Kurihara ............. G01R 31/025 324/426 |
| 2016/0293953 A1* | 10/2016 | Shimonishi ............. H01B 1/08 |
| 2016/0359203 A1* | 12/2016 | Schmiegel ............ H01M 10/44 |

FOREIGN PATENT DOCUMENTS

| JP | H11250929 A | 9/1999 |
| KR | 10-2000-0042002 A | 7/2000 |
| KR | 10-1093960 B1 | 12/2011 |
| KR | 10-2014-0139357 A | 12/2014 |
| KR | 10-1650041 B1 | 8/2016 |

* cited by examiner

*Primary Examiner* — David M. Gray
*Assistant Examiner* — Michael A Harrison
(74) *Attorney, Agent, or Firm* — Mintz Levin Cohn Ferris Glovsky and Popeo, P.C.; Steven M. Jensen

(57) ABSTRACT

A method for predicting a lifespan of a secondary battery within a short time in a more accurate and effective way is provided. The method for assessing a lifespan of a secondary battery includes primarily aging a prepared secondary battery for a predetermined time, initially charging the primarily aged secondary battery to a predetermined SOC and secondarily aging the initially charged secondary battery for a duration greater than the primary aging. Additionally, degassing removes gas in the secondarily aged secondary battery. Further, the method includes charging the secondary battery with a primary low-current at C-rate of 1/15 C or less, after the degassing step, discharging the secondary battery with a primary low-current at C-rate of 1/15 C or less, after the primary low-current charging step and determining a lifespan of the secondary battery by using a difference of voltages measured at different time points.

8 Claims, 9 Drawing Sheets

METHOD AND APPARATUS FOR ASSESSING LIFESPAN OF SECONDARY BATTERY

CROSS-REFERENCE TO RELATED APPLICATIONS

The present application claims priority to Korean Patent Application No. 10-2016-0170661 filed on Dec. 14, 2016, the disclosures of which are incorporated herein by reference in its entirety.

TECHNICAL FIELD

The present disclosure relates to a secondary battery assessing technique, and more particularly, to a technique for assessing a lifespan of a secondary battery in a more accurate and effective way.

RELATED ART

Generally, a secondary battery is a battery that may be charged and discharged, different from a primary battery that is not able to be charged. The secondary battery is widely used in electronic devices such as mobile phones, notebook computers and camcorders, or electric vehicles. In particular, a lithium secondary battery tends to be utilized since it has a greater capacity than a nickel-cadmium battery or a nickel-hydrogen battery and has a greater energy density per unit weight.

The lithium secondary battery mainly uses lithium-based oxide and carbonaceous material as a positive electrode active material and a negative electrode active material, respectively. The lithium secondary battery includes an electrode assembly in which a positive electrode plate and a negative electrode plate respectively coated with a positive electrode active material and a negative electrode active material are disposed with a separator being interposed therebetween and an exterior that accommodates the electrode assembly together with an electrolytic solution in a sealed state. Further, the lithium secondary battery is classified as a can-type secondary battery in which the electrode assembly is disposed in a metal cylinder, and a pouch-type secondary battery in which the electrode assembly is disposed in a pouch made of aluminum laminate sheets based on the shape of the battery case.

The secondary battery is generally manufactured by injecting a liquid electrolyte, (e.g., an electrolytic solution), into a battery case which accommodates the electrode assembly and then seals the battery case. In particular, the lithium secondary battery requires an accurate assessment of the life of the secondary battery, for example by informing a user of an appropriate replacement period, calculating a battery degradation rate, finding a problem at the manufacture of the secondary battery, and finding a solution thereto. Accordingly, many technologies have been proposed to determine the life of a secondary battery, but most techniques require considerable time. Alternatively, in some technologies, the life of the secondary battery is determined in a relatively short time, but its accuracy is compromised.

The above information disclosed in this section is merely for enhancement of understanding of the background of the disclosure and therefore it may contain information that does not form the prior art that is already known in this country to a person of ordinary skill in the art.

SUMMARY

The present disclosure provides an apparatus and method for assessing a lifespan of a secondary battery within a short time in more accurate and more efficient manner.

In an aspect of an exemplary embodiment of the present disclosure, a method for assessing a lifespan of a secondary battery may include primarily aging a prepared secondary battery for a predetermined time, initially charging the primarily aged secondary battery to a predetermined state of charge (SOC), secondarily aging the initially charged secondary battery for a greater duration than the primary aging, degassing by removing gas in the secondarily aged secondary battery, charging the secondary battery with a primary low-current at C-rate of 1/15 C or less, after the degassing step, discharging the secondary battery with a primary low-current at C-rate of 1/15 C or less, after the primary low-current charging step and determining a lifespan of the secondary battery by using a difference of voltages measured at different time points.

In some exemplary embodiments, in the primary low-current charging step, the secondary battery may be fully charged at C-rate of 1/15 C or less, and in the primary low-current discharging step, the secondary battery may be fully discharged at C-rate of 1/15 C or less. In addition, in the initial charging step, the secondary battery may be charged to SOC of 30% or less.

In addition, the method for assessing a lifespan of a secondary battery may further include after primarily discharging the low-current and before determining the lifespan, charging the primarily low-current-discharged secondary battery with a secondary low-current at C-rate of 1/15 C or less; and a secondary low-current discharging step of discharging the secondary battery with a secondary low-current discharge at C-rate of 1/15 C or less, after the secondary low-current charging.

In other exemplary embodiments, determining the lifespan may include, comparing a voltage measured during the primary low-current charging and a voltage measured during the secondary low-current charging to determine a lifespan of the secondary battery. Additionally, the primary aging may be performed for 10 hours to 14 hours, and the secondary aging may be performed for 24 hours to 72 hours. Further in some exemplary embodiments, in t determining the lifespan, the difference of voltages measured at different time points may be compared with a reference value to determine whether the secondary battery has an acceptable value.

In another aspect of an exemplary embodiment of the present disclosure, an apparatus for assessing a lifespan of a secondary battery, may include a primary aging component configured to age a prepared secondary battery for a predetermined time, an initial charging component configured to charge the primarily aged secondary battery to a predetermined state of charge (SOC), a secondary aging component configured to age the initially charged secondary battery for a greater duration than the aging time by the primary aging component, a degassing component configured to remove gas in the secondary battery secondarily aged by the secondary aging component, a primary low-current charging component configured to charge the secondary battery, from which gas is removed by the degassing component, at C-rate of 1/15 C or less, a primary low-current discharging component configured to discharge the secondary battery primarily charged by the primary low-current charging component at C-rate 1/15 C or less, and a life determining component configured to determine a lifespan of the secondary battery by using a difference of voltages measured at different time points.

BRIEF DESCRIPTION OF THE DRAWINGS

The accompanying drawings illustrate an exemplary embodiment of the present disclosure and together with the foregoing disclosure, serve to provide further understanding of the technical features of the present disclosure, and thus, the present disclosure is not construed as being limited to the drawing.

DETAILED DESCRIPTION

Hereinafter, exemplary embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, in order to make the description of the present disclosure clear, unrelated parts are not shown and, the thicknesses of layers and regions are exaggerated for clarity. Further, when it is stated that a layer is "on" another layer or substrate, the layer may be directly on another layer or substrate or a third layer may be disposed therebetween.

General terms used as widely as possible at present are selected as the terms used in this disclosure while a function thereof in the disclosure is considered, but the terms may be changed according to intention of those skilled in the art, precedent, emergence of new technique, or the like. In addition, in a specific case, there may also be terms arbitrarily selected by the applicant, and in this case, the meaning of the terms may be described in detail in the description section of the disclosure. Thus, the terms used in this disclosure should be defined not on the basis of the simple names thereof but on the basis of the meaning thereof and contents thereof entirely over the present disclosure.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Figure 1:
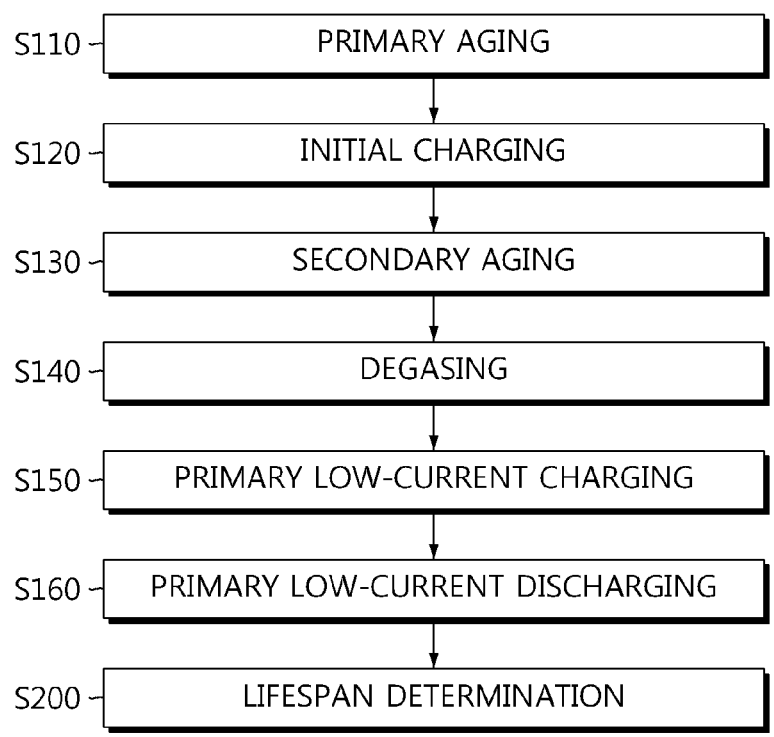
FIG. 1 is an exemplary flowchart for schematically illustrating a method for assessing a lifespan of a secondary battery according to an exemplary embodiment of the present disclosure.

FIG. 1 is an exemplary flowchart for schematically illustrating a method for assessing a lifespan of a secondary battery according to an exemplary embodiment of the present disclosure. Referring to FIG. 1, a method for assessing a lifespan of a secondary battery according to the present disclosure may include a primary aging step (e.g., primarily aging) (S110), an initial charging step (e.g., initially charging) (S120), a secondary aging step (e.g., secondarily aging) (S130), a degassing step (e.g., degassing) (S140), a primary low-current charging step (e.g., charging with a primary low current) (S150), a primary low-current discharging step (e.g., discharging with a primary low current) (S160) and a life determining step (e.g., determine a lifespan) (S200). In the primary aging step (S110), the secondary battery may be aged for a predetermined time. In this aging step, a prepared secondary battery may be stored at a predetermined temperature.

In particular, in the aging step, the secondary battery may be stored at normal temperature, within a range of about 20° C. to about 25° C. For example, in the primary aging step (S110), the secondary battery may be stored for a predetermined time in a chamber which is configured to maintain normal temperature. The primary aging step (S110) may be performed after the secondary battery is fabricated. In particular, the secondary battery to which the method for assessing a lifespan of a secondary battery according to the present disclosure is performed may be prepared in various forms.

Figure 2:
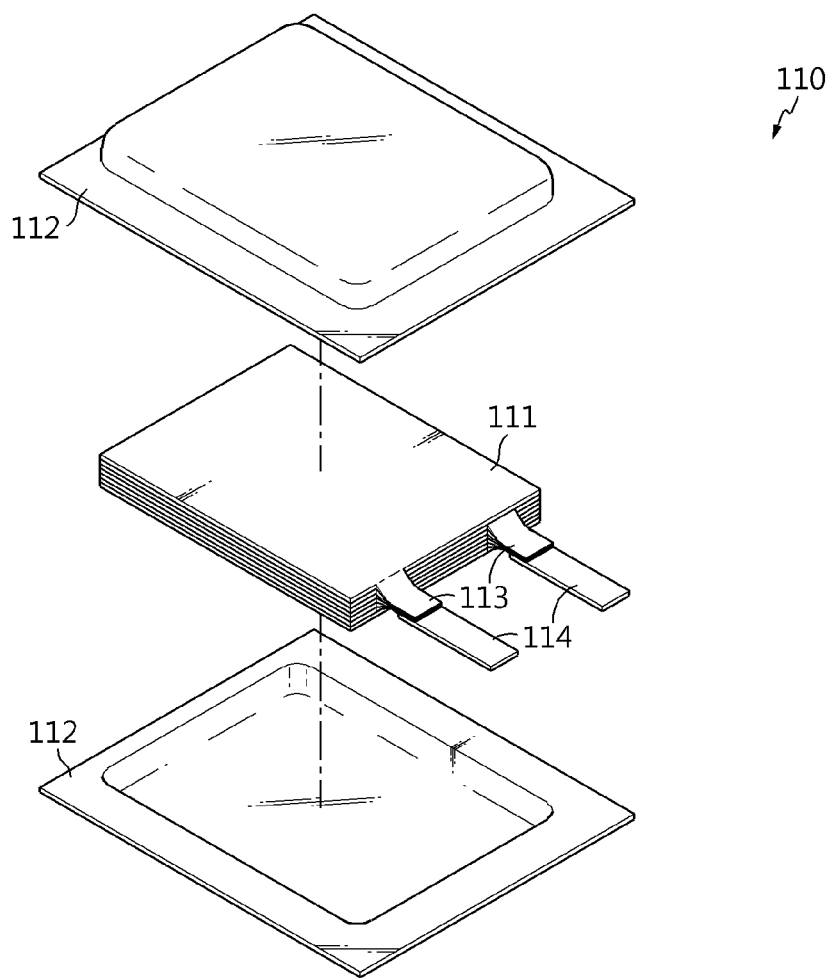
FIG. 2 is an exemplary exploded perspective view schematically showing a secondary battery at which a primary aging step is performed according to an exemplary embodiment of the present disclosure.
Figure 3:
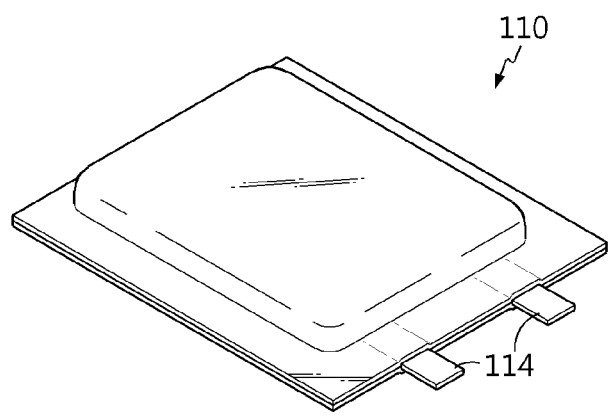
FIG. 3 is an exemplary perspective view of FIG. 2 in an assembled state according to an exemplary embodiment of the present disclosure.

FIG. 2 is an exemplary enlarged perspective view schematically showing a secondary battery at which a primary aging step is performed according to an exemplary embodiment of the present disclosure. FIG. 3 is an exemplary perspective view of FIG. 2 in an assembled state. Referring to FIGS. 2 and 3, a secondary battery 110 to which the primary aging step is performed may be configured to dispose an electrode assembly in a battery case.

For example, the electrode assembly 111 may be configured having a positive electrode plate and a negative electrode plate disposed with a separator being interposed therebetween. In addition, the electrode plates of the electrode assembly may be formed by coating a current collector with active material slurry. The slurry may be generally prepared by stirring a solvent in which granular active material, auxiliary conductor, binder, plasticizer and the like are added. Additionally, each of the electrode plates may have an uncoated portion not coated with the slurry, and an electrode tab 113 corresponding to each electrode plate may be attached to the uncoated portion. Further, a first end of the electrode lead 114 may be attached and coupled to the electrode tab 113, and a second end of the electrode lead 114 may be exposed external to the battery case to provide an electrode terminal which may be connected to another secondary battery or an external device such as a bus bar, a load, a charging device or the like.

The electrolytic solution may be a liquid electrolyte and may provide for ion transfer between the positive electrode plate and the negative electrode plate. In particular, the secondary battery may be charged or discharged by the ion exchange between the positive electrode plate and the negative electrode plate. The lithium secondary battery may use a nonaqueous electrolytic solution. The battery case 112 may have an interior cavity and may accommodate the electrode assembly and the electrolytic solution in the interior cavity. The battery case may be classified into a pouch-type case in which a metal layer made of aluminum or the like is interposed between polymer layers, and a can-type case having a cylindrical or rectangular can shape formed from metal. Methods and apparatuses in accordance with embodiments of the present invention may be applied to various types of secondary batteries, including, but not limited to, pouch-type secondary batteries.

Referring to the configuration of FIGS. 2 and 3, the pouch-type case may have a concave interior cavity and may accommodate the electrode assembly and the electrolytic solution in the interior cavity. In addition, as shown in the figures, the pouch-type case may be formed from an upper pouch and a lower pouch, and their outer circumferences may be fused to form a sealing portion, thereby sealing the interior cavity.

When the electrode assembly is accommodated in the battery case and then the battery case is sealed after injecting the electrolytic solution therein to fabricate the secondary battery as shown in FIGS. 2 and 3, the primary aging step (S110) may be performed instantly. In primary aging step, the electrolytic solution injected into the battery case during the battery preparing process may be spread throughout the interior of the battery case. In particular, to facilitate ion exchange between the positive electrode plate and the negative electrode plate, the separator may be impregnated with the electrolytic solution as a whole. In the primary aging step, the separator may be impregnated with the electrolytic solution uniformly as a whole. In particular, the primary aging step may be performed in a range of about 10 hours to about 14 hours. For example, in the primary aging step, the prepared secondary battery may be stored for about 12 hours at normal temperature. In other words, the separator may be more efficiently impregnated with the electrolytic solution within a short time duration.

In the initial charging step (S120), the secondary battery primarily aged during Step S110 may be charged to a predetermined SOC. In particular, in Step S120, the secondary battery may be charged to SOC of about 30% or less. For example, in Step S120, the secondary battery may be charged until the SOC reaches about 30%. In this configuration of the present disclosure, additives may be more smoothly decomposed, and a solid electrolyte interphase (SEI) layer may be more easily formed at the negative electrode plate. Further, in Step S120, the secondary battery may be charged to have SOC in a range of about 30% to about 70%, so that the following degassing step may be performed more easily.

In particular, in Step S120, the secondary battery may be charged at various C-rates. For example, in Step S120, the secondary battery may be charged at C-rate of 0.1 C. In particular, when the secondary battery is charged for about 3 hours, the secondary battery may be charged to have SOC of approximately 30%. Step S120 may be performed at temperature of about 60° C. or less. Further, Step S120 may be performed at normal temperature. In the secondary aging step (S130), the secondary battery to which S120 may be performed is aged again. In other words, in Step S130, the initially charged secondary battery may be stored in a predetermined temperature range to be stabilized. For example, in Step S130, the secondary battery may be stably maintained in a chamber which is maintained in a range of about 20° C. to about 60° C., for example at normal temperature.

In particular, the secondary aging step (S130) may be performed for a greater duration than the primary aging step (S110). For example, in Step S130, the secondary battery may be stored at normal temperature for 24 hours to 72 hours. In particular, in the secondary aging step (S130), the additives in the electrolytic solution may be decomposed. Thus, during this step, a SEI layer may be more stably formed at the surface of the electrode plate.

In the degassing step (S140), the gas generated in the secondary battery may be removed. In particular, while Steps S120 and S130 are performed, gas may be generated in the secondary battery. In Step S140, the gas generated in the secondary battery to stay in the secondary battery may be removed from the interior of the secondary battery. The degassing step may adopt various degassing techniques known in the art. For example, in the degassing step, in a pouch-type secondary battery having an elongated side, the elongated portion may be cut and then the cut portion may be sealed for degassing. However, such a degassing technique is broadly known in the art and thus not described in detail here.

In the primary low-current charging step (S150), the secondary battery may be charged at low C-rate, after Step S140. In other words, in the primary low-current charging step (S150), the secondarily aged secondary battery may be charged with a low current. For example, in Step S150, the secondary battery may be charged at C-rate of 1/15 C (about 0.0667 C) or less. Further, in Step S150, the secondary battery may be charged at C-rate of 1/20 C or less. In particular, in Step S150, the secondary battery may be charged at low charging C-rate until being fully charged. The oxidation and reduction reactions of the electrolytic solution at the surfaces of the positive electrode and the negative electrode may be greatest at cycles with SOC of 100 to 0%. In particular, in a fully charged state, the electrolytic solution oxidation reaction occurs at the surface of the positive electrode, and this side reaction may occur at the charging capacity. Thus, since the low-current charging of Step S150 is performed until the secondary battery is fully charged, the lifespan of the secondary battery may be more accurately accessed.

For example, in Step S150, the secondary battery may be charged at C-rate of 0.05 C in a 4.2V Constant Current (CC)/Constant Voltage (CV) 5% current cut-off mode. The primary low-current charging step (S150) may be performed at temperature in the range of about 20° C. to about 60° C. For example, Step S150 may be performed at normal temperature.

In the primary low-current discharging step (S160), the secondary battery may be discharged at low C-rate, after Step S150. In other words, in the primary low-current discharging step (S160), the secondary battery charged with a low current in Step S150 may be discharged with a low current again. For example, in Step S160, the secondary battery may be discharged at C-rate identical or similar to the charging C-rate of Step S150. In particular, in Step S160, the secondary battery may be discharged at C-rate of 1/15 C or less. Further, in Step S160, the secondary battery may be discharged at C-rate of 1/20C or less.

In particular, in Step S160, the secondary battery may be discharged at low C-rate with a low current so that the SOC reaches 30% or less. Further, in Step S160, the secondary battery may be discharged until being fully discharged. Accordingly, the lifespan of the secondary battery may be assessed more conveniently and accurately. In particular, since the electrolytic solution decomposition reaction may occur an early stage and also consistently, it is desirable that the secondary battery may be discharged with a low current until the SOC is less than 30%. Further, when the secondary battery is discharged with a low current until the SOC reaches 0%, (e.g., until being fully discharged), in the following life determining step, significant efforts to discharge the secondary battery are not required to enable the SOC to reach the same level. For example, in Step S160, the secondary battery may be discharged until the secondary battery has a voltage of about 2.5V. The primary low-current discharging step (S160) may be performed at temperature range of about 20° C. to about 60° C. For example, Step S160 may be performed at normal temperature.

In the life determining step (S200), the lifespan of the secondary battery may be determined. In particular, in the life determining step (S200), the lifespan of the secondary battery may be determined by using a difference between voltages measured at different two time points. For example, in Step S200, a difference between a voltage at a predetermined time point during the primary low-current charging step (S150) and a voltage at a predetermined time point during the primary low-current discharging step (S160) may be calculated, and the lifespan of the secondary battery may be determined using the calculated voltage difference. For example, in the life determining step, the lifespan of the secondary battery may be determined by using Open Circuit Voltage (OCV) or Closed Circuit Voltage (CCV) as a voltage of the secondary battery.

For example, in the life determining step (S200), a voltage at a time point when the primary low-current charging step (S150) starts and a voltage at a time point when the primary low-current discharging step (S160) ends may be compared. The lifespan of the secondary battery may be determined using a difference of the voltages. In particular, in the life determining step (S200), the lifespan of the secondary battery may be determined to be an acceptable value. For example, in the life determining step (S200), voltages at different two time points may be compared to calculate a difference value thereof, then the difference value may be compared with a reference value (e.g., a reference range). When the measured difference value is beyond the reference value, the lifespan of the secondary battery may be determined as insufficient (e.g., bad).

Figure 4:
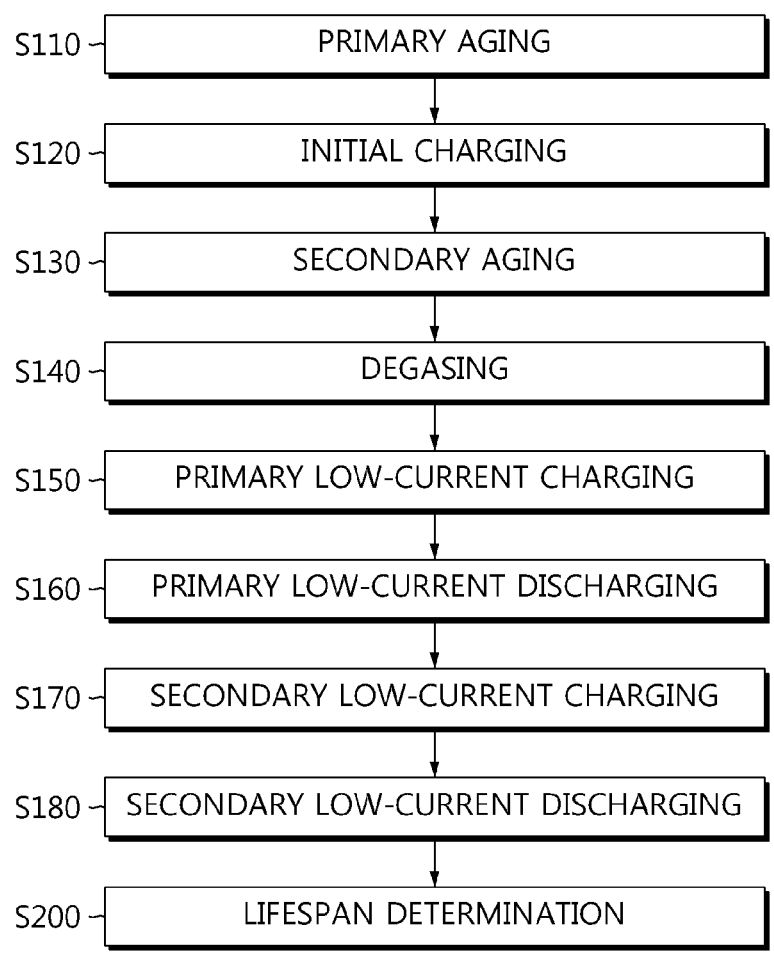
FIG. 4 is an exemplary flowchart for schematically illustrating a method for assessing a lifespan of a secondary battery according to another exemplary embodiment of the present disclosure.

FIG. 4 is an exemplary flowchart for schematically illustrating a method for assessing a lifespan of a secondary battery according to an exemplary embodiment of the present disclosure. Referring to FIG. 4, the method for assessing a lifespan of a secondary battery according to an exemplary embodiment of the present disclosure may include a primary aging step (e.g., primarily aging) (S110), an initial charging step (e.g., initially charging) (S120), a secondary aging step (e.g., secondarily aging) (S130), a degassing step (e.g., degassing) (S140), a primary low-current charging step (e.g., charging with a primary low-current) (S150), a primary low-current discharging step (e.g., discharging with a primary low-current) (S160), a secondary low-current charging step (e.g., charging with a secondary low-current) (S170), a secondary low-current discharging step (e.g., discharging with a secondary low-current) (S180) and a life determining step (e.g., determine a lifespan) (S200). When the embodiment of FIG. 4 is compared with the exemplary embodiment of FIG. 1, Steps S110 to S160 of FIG. 4 are identical to Steps S110 to S160 of FIG. 1, and Steps S170 and S180 are added after S160 and before S200. Accordingly, Steps S110 to S160 of FIG. 4 will not described in detail here, and Steps S170 and S180 will be described in more detail.

In the secondary low-current charging step (S170), the secondary battery to which Step S160 is performed may be charged at low C-rate. In other words, in the secondary low-current charging step (S170), the primarily low-current-discharged secondary battery may be charged with a low current again. In particular, in Step S170, the secondary battery may be charged at the same (e.g., or substantially similar) C-rate as in the primary low-current charging step (S150). For example, in Step S170, the secondary battery may be charged at C-rate of 1/15 C or less. In addition, in Step S170, the secondary battery may be charged until reaching a fully charged condition. For example, in Step S170, the secondary battery may be charged at C-rate of 0.05 C in a 4.2V Constant Current (CC)/Constant Voltage (CV) 5% current cut-off mode.

In the secondary low-current discharging step (S180), the secondary battery to which Step S170 is performed may be discharged at low C-rate. In other words, in the secondary low-current discharging step (S180), the secondarily low-current-charged secondary battery may be discharged with a low current. In particular, in Step S180, the secondary battery may be discharged at C-rate identical or similar to the charging C-rate of Step S170. Additionally, in Step S180, the secondary battery may be discharged at the same (e.g., or substantially similar) C-rate as the discharging C-rate of Step S160. Further, in Step S180, the secondary battery may be discharged to reach the same state (SOC) as Step S160. For example, in Step S180, the secondary battery may be discharged at C-rate of 1/15 C or less. In Step S180, the secondary battery may be discharged at C-rate of 1/15 C or less until being fully discharged. For example, in Step S180, the secondary battery may be discharged at C-rate of about 0.05 C until the secondary battery has a voltage of about 2.5V.

In Steps S170 and S180, charging and discharging may be performed in the same pattern (C-rate, SOC) as in Steps S150 and S160, respectively. When the charging/discharging processes are identically repeated, their difference may be determined via comparison. In the life determining step (S200), a voltage measured in the primary low-current charging step and a voltage measured in the secondary low-current charging step may be compared to determine a lifespan of the secondary battery.

In particular, in the life determining step, the lifespan of the secondary battery may be determined by comparing voltages at two time points having the same capacity, when accumulated charging/discharging capacities are depicted. For example, in the life determining step, a difference between a voltage at a specific capacity (e.g., 450 mAh) in the primary low-current charging step and a voltage at a point in the secondary low-current charging step where the accumulated charging/discharging capacity is identical (e.g., 450 mAh) may be obtained, and when the voltage difference exceeds the reference value, the lifespan of the secondary battery may be determined as having an unacceptable value (e.g., bad).

Figure 5:
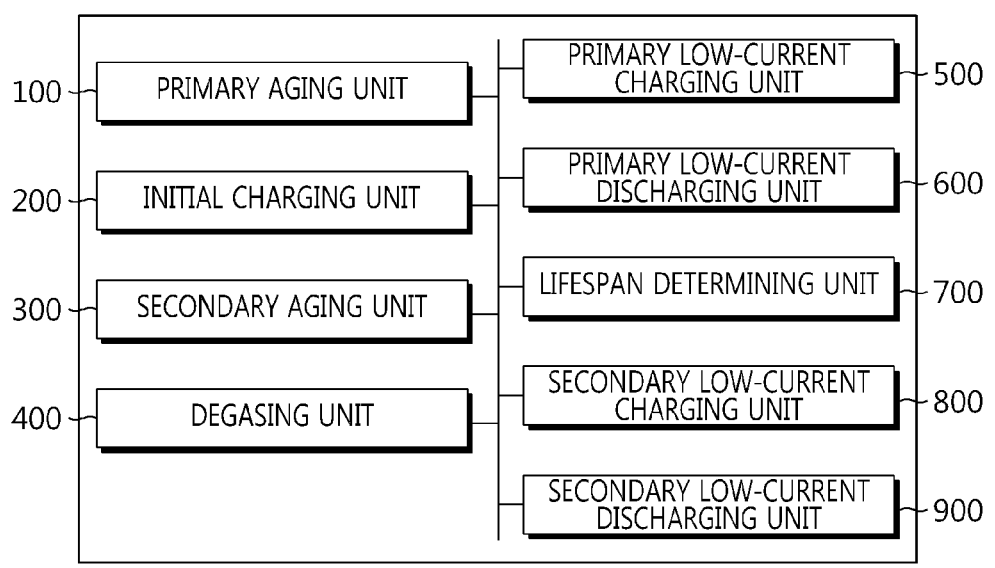
FIG. 5 is an exemplary block diagram schematically showing a functional configuration of an apparatus for assessing a lifespan of a secondary battery according to an exemplary embodiment of the present disclosure.

FIG. 5 is an exemplary block diagram schematically showing a functional configuration of an apparatus for assessing a lifespan of a secondary battery according to an exemplary embodiment of the present disclosure. The apparatus for assessing a lifespan of a secondary battery may perform the method for assessing a lifespan of a secondary battery, described above. Referring to FIG. 5, the apparatus for assessing a lifespan of a secondary battery according to the present disclosure may include a primary aging component 100, an initial charging component 200, a secondary aging component 300, a degassing component 400, a primary low-current charging component 500, a primary low-current discharging component 600 and a life determining component 700.

The primary aging component 100 may age a prepared secondary battery for a predetermined time. In particular, the primary aging component may be configured to perform the primary aging step (e.g., primarily aging) (S110) in the exemplary embodiment depicted in FIG. 1. The primary aging component may be configured to stably maintain the secondary battery at a predetermined temperature. For example, the primary aging component may include a chamber having an interior cavity and to maintain an internal temperature within a predetermined range.

The initial charging component 200 may charge the secondary battery primarily aged by the primary aging component to a predetermined SOC. In particular, the initial charging component may be configured to perform the initial charging step (e.g., initially charging) (S120) in the exemplary embodiment depicted in FIG. 1. For example, the initial charging component may include a power generating component for generating power to be supplied to the secondary battery and a connection terminal configured to contact an electrode lead of the secondary battery to transmit the power supplied from the power generating component to the secondary battery.

The secondary aging component 300 may age the secondary battery charged by the initial charging component 200. Further, the secondary aging component may be configured to age the secondary battery for a greater duration of time than the time during which the primary aging component ages the secondary battery. The secondary aging component 300 may be configured to perform the secondary aging step (e.g., secondarily aging) (S130) in the exemplary embodiment depicted in FIG. 1. In addition, the secondary aging component may be configured similar to the primary aging component described above. For example, the secondary aging component may also include a chamber having an interior cavity and may maintain an internal temperature within a predetermined range.

The degassing component 400 may degas the secondary battery secondarily aged by the secondary aging component. In particular, the degassing component may be configured to perform the degassing step (e.g., degassing) (S140) in the exemplary embodiment depicted in FIG. 1. For example, the degassing component may have a cutting element for partially cutting the secondary battery to discharge gas in the secondary battery and a fusing element for fusing the cut portion.

The primary low-current charging component 500 may charge the secondary battery degassed by the degassing component at C-rate of 1/15 C or less. In other words, the primary low-current charging component may be configured to perform the primary low-current charging step (e.g., charging with a primary low-current) (S150) in the exemplary embodiment depicted in FIG. 1. In order to charge the secondary battery, the primary low-current charging component may be configured similar to the initial charging component. However, the primary low-current charging component may be configured to charge the secondary battery at lower C-rate in comparison to the initial charging component. For example, the primary low-current charging component may be configured to fully charge the secondary battery at C-rate of about 0.05 C in about 4.2V CC/CV 5% current cut-off mode.

The primary low-current discharging component 600 may discharge the secondary battery charged with a low current by the primary low-current charging component at C-rate of 1/15 C or less. In other words, the primary low-current discharging component may be configured to perform the primary low-current discharging step (e.g., discharging with a primary low-current) (S160) in the exemplary embodiment depicted in FIG. 1. The primary low-current discharging component may include a load consuming a discharging power and a connection terminal connected to an electrode lead of the secondary battery, as a configuration for discharging the secondary battery. For example, the primary low-current discharging component may be configured to fully discharge the secondary battery at C-rate of about 0.05 C to fully discharge the secondary battery until the secondary battery has a voltage of about 2.5V.

The life determining component 700 may determine a lifespan of the secondary battery using a difference of voltages measured at different two time points. In other words, the life determining component may be configured to perform the life determining step (e.g., determining a lifespan) (S200) in the exemplary embodiment depicted in FIG. 1. For this, the life determining component may include a voltage measuring element for measuring a voltage of the secondary battery at a predetermined time point, a comparing element for comparing a difference of voltages measured at two or more time points with a reference value to determine a lifespan of the secondary battery, a memory for storing the reference value to be compared with the difference of voltages, and the like. The apparatus for assessing a lifespan of a secondary battery according to the present disclosure may further include a secondary low-current charging component 800 and a secondary low-current discharging component 900.

The secondary low-current charging component 800 may charge the secondary battery, primarily discharged with a low current by the primary low-current discharging component, at C-rate of 1/15 C or less again. In particular, the secondary low-current charging component may be configured to perform the secondary low-current charging step (e.g., charging with a secondary low-current) (S170) in the exemplary embodiment depicted in FIG. 1. In order to charge the secondary battery, the secondary low-current charging component may be configured similar to the primary low-current charging component. In addition, the secondary low-current charging component may charge the secondary battery at the same (e.g., or substantially C-rate as the primary low-current charging component. For example, the secondary low-current charging component may be configured to fully charge the secondary battery at C-rate of about 0.05 C in about 4.2V CC/CV mode.

The secondary low-current discharging component 900 may discharge the secondary battery, secondarily charged with a low current by the secondary low-current charging component, at C-rate of 1/15 C or less again. In other words, the secondary low-current discharging component may be configured to perform the secondary low-current discharging step (S180) in the exemplary embodiment depicted in FIG. 1. In order to discharge the secondary battery, the secondary low-current discharging component may be configured identical or similar to the primary low-current discharging component. In addition, the secondary low-current discharging component may discharge the secondary battery at the same (e.g., or substantially similar) C-rate as the primary low-current discharging component. For example, the secondary low-current discharging component may discharge the secondary battery at C-rate of about 0.05 C until the secondary battery has a voltage of about 2.5V.

Hereinafter, examples are described in detail to specifically explain the present disclosure. The examples according to the present disclosure, however, may be modified in many other forms, and the scope of the present disclosure should not be construed as being limited to the following examples. The examples of the present disclosure are provided to explain the present disclosure more clearly and fully to those having ordinary knowledge in the art to which the present disclosure pertains.

EXAMPLE 1 AND COMPARATIVE EXAMPLE 1

Two secondary batteries having the same configuration and shape were prepared as Example 1 and Comparative Example 1, as follows.

First, 93 wt % of $LiNiMnCoO_2$ serving as a positive electrode active material, 3 wt % of PVDF and 4 wt % of acetylene black were mixed to prepare positive electrode slurry, which was coated on an aluminum current collector. In addition, the aluminum current collector was dried with hot air at 130° C. and roll-pressed to prepare a positive electrode plate with a thickness of 100 um. Further, 96 wt % of natural graphite serving as a negative electrode active material, 1 wt % of Denka black (conductive agent), 2 wt % of Styrene Butadiene Rubber (SBR) and 1 wt % of CarboxylMethyl Cellulose (CMC) were mixed to prepare negative electrode slurry, and the prepared negative electrode slurry was coated on a copper current collector. The copper current collector was dried with hot air at 80° C. and roll-pressed to prepare a negative electrode plate with a thickness of 130 um. The prepared electrodes were stacked with a separator being interposed therebetween and then accommodated in a pouch exterior along with an electrolytic solution. At this time, $LiPF_6$ 1.0M and ethylene carbonate (EC)/ethyl methyl carbonate (EMC) (3:7) were used as the electrolytic solution.

EXAMPLE 2 AND COMPARATIVE EXAMPLE 2

Two secondary batteries having the same configuration and shape were prepared as Example 2 and Comparative Example 2. The secondary batteries of Example 2 and Comparative Example 2 were substantially identical to the secondary batteries of Example 1 and Comparative Example 1, except that Vinyl Carbonate (VC) was added to the electrolytic solution as an additive.

Four secondary batteries prepared as above (Examples 1 and 2, Comparative Examples 1 and 2) were aged for 12 hours at normal temperature, and then each secondary battery was charged for 3 hours at C-rate of 0.1 C until the SOC reaches 30%. Next, each secondary battery was secondarily aged for 2 days at normal temperature and then degassed. Additionally, each secondary battery was primarily charged, primarily discharged, secondarily charged and secondarily discharged in order. At this time, each secondary battery included primary charging and secondary charging to fully charge the secondary battery in a 4.2V CC/CV 5% current cut-off mode. In addition, the primary discharging and the secondary discharging were performed to enable the secondary battery to be fully discharged and have a voltage of 2.5V.

However, for the secondary batteries of Examples 1 and 2, the primary charging/discharging and the secondary charging/discharging were performed at C-rate of 0.05 C. Additionally, for the secondary batteries of Comparative Examples 1 and 2, the primary charging/discharging and the secondary charging/discharging were performed at C-rate of 0.33 C.

Figure 6:
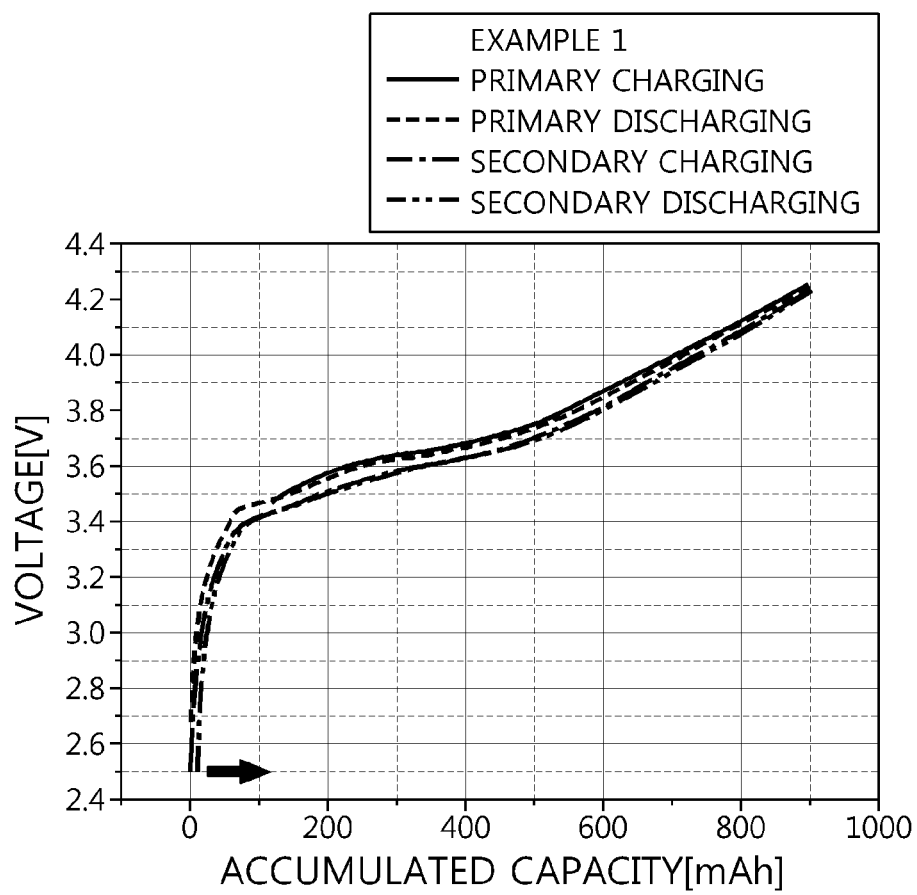
FIG. 6 is an exemplary graph showing primary and secondary charging and/or discharging voltage profiles of according to Example 1 of an exemplary embodiment of the present disclosure.
Figure 7:
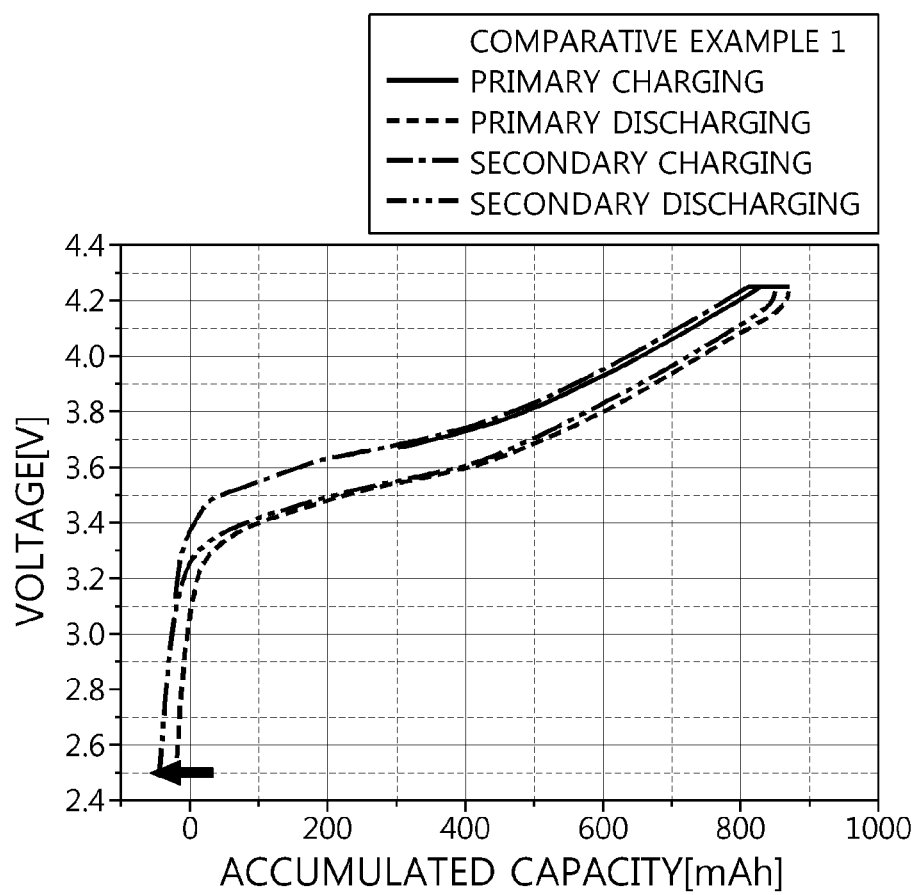
FIG. 7 is an exemplary graph showing primary and secondary charging and/or discharging voltage profiles according to Comparative Example 1 of an exemplary embodiment of the present disclosure.
Figure 8:
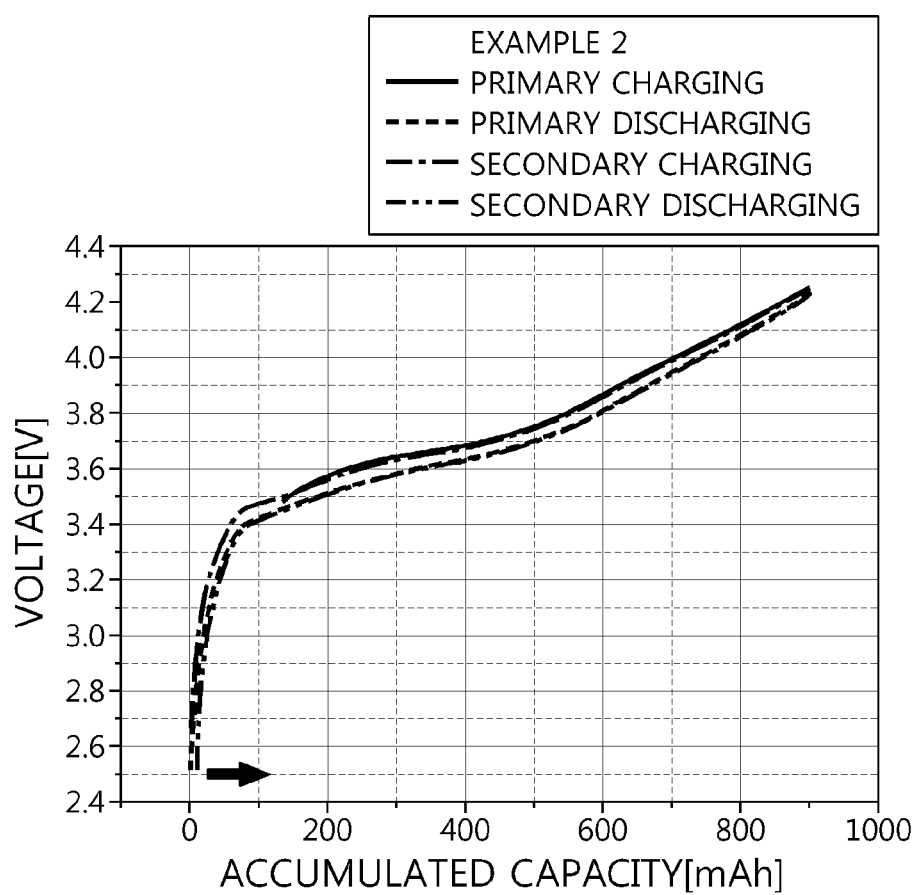
FIG. 8 is an exemplary graph showing primary and secondary charging and/or discharging voltage profiles according to Example 2 of an exemplary embodiment of the present disclosure.
Figure 9:
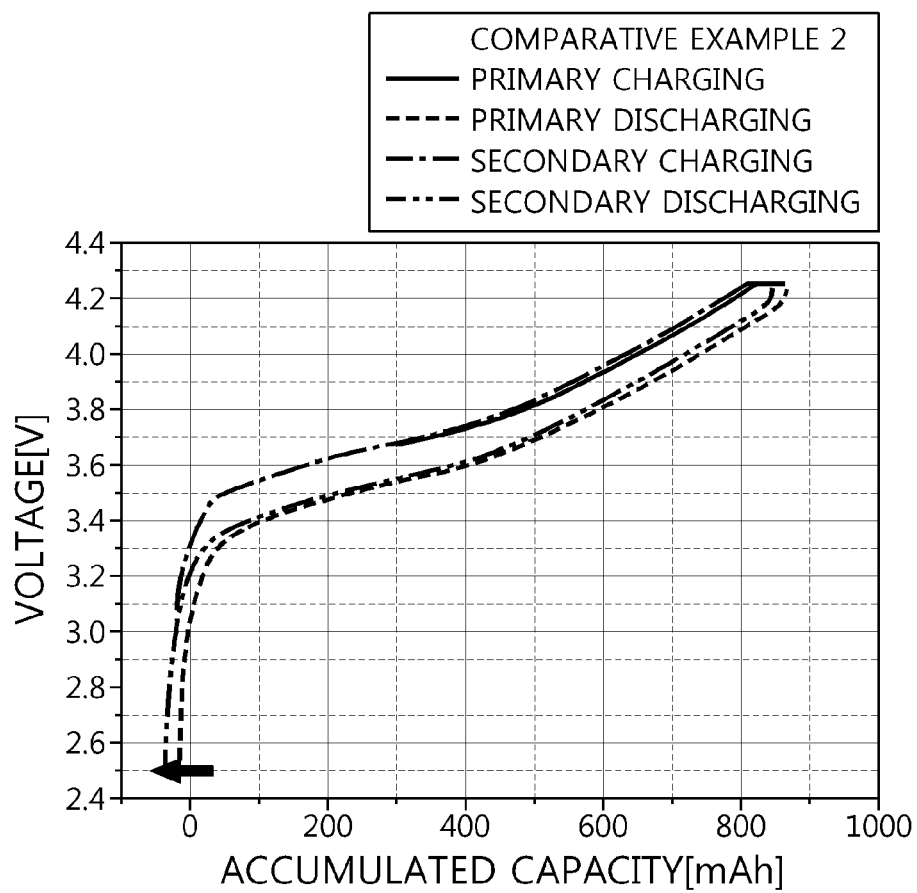
FIG. 9 is an exemplary graph showing primary and secondary charging and/or discharging voltage profiles according to Comparative Example 2 of an exemplary embodiment of the present disclosure.

In addition, the profile of voltage at each accumulated charging/discharging capacity with respect to the charging/discharging is depicted in FIGS. 6 to 9. In more detail, FIG. 6 is an exemplary graph showing the primary and secondary charging/discharging voltage profiles of according to Example 1, and FIG. 7 is an exemplary graph showing the primary and secondary charging/discharging voltage profiles according to Comparative Example 1. Additionally, FIG. 8 is an exemplary graph showing the primary and secondary charging/discharging voltage profiles according to Example 2. FIG. 9 is an exemplary graph showing the primary and secondary charging/discharging voltage profiles according to Comparative Example 2.

First, as shown in FIG. 6 according to Example 1 of the present disclosure, a charging capacity is greater than a discharging capacity. For example, FIG. 6 shows that a secondary charging capacity is greater than a primary discharging capacity. Further, in FIG. 6, as indicated by an arrow, an end point of the primary discharging graph is located right in comparison to an end point of the secondary discharging graph. In addition, this may be regarded as a general pattern of the secondary battery. In other words, as shown in FIG. 6, a general secondary battery may include the discharging capacity that is unable to the greater than the charging capacity due to various side reactions such as the electrolytic solution decomposition reaction. In addition, as a shift to the right is greater in FIG. 6, it may be determined that a voltage difference is greater with the same capacity and the lifespan is further degraded.

Additionally, as shown in FIG. 7 according to Comparative Example 1, a discharging capacity is greater than a charging capacity. For example, in FIG. 7, an end point of the secondary discharging graph is located left in comparison to a start point of the secondary charging graph. In addition, as shown in FIG. 7, an end point of the secondary discharging graph is located left in comparison to an end point of the primary discharging graph. In other words, it may be regarded that the end point of the secondary discharging graph moves to the left as indicated by an arrow, in comparison to the end point of the primary discharging graph. This may not be regarded as a general pattern of the secondary battery.

In addition, in case of a high-current charging/discharging, it may be interpreted that the voltage profile is influenced by the side reaction caused by electrolytic solution decomposition and also an overvoltage caused by electrode irregularity (e.g., in a pore structure, binder distribution, electric conductivity distribution or the like). Further, in FIG. 6, due to the low-current charging/discharging, such overvoltage is prevented as much as possible to more accurately monitor the reactions of the electrolytic solution and additives giving an influence on the lifespan. Thus, it may be understood that in the configuration of Example 1 of FIG. 6, the change of a charging/discharging voltage profile caused by side reactions of the electrolytic solution at the secondary battery may be observed relatively accurately, but in the configuration of Comparative Example 1 of FIG. 7, the change of the charging/discharging voltage profile is unable to be accurately observed.

In addition, as shown in FIG. 8 according to Example 2 of the present disclosure, similar to FIG. 6, a charging capacity is exhibited greater than a discharging capacity, and an end point of the secondary discharging graph is located to the right as indicated by an arrow, in comparison to a start point of the secondary charging graph and an end point of the primary discharging graph. Further, as shown in FIG. 9 according to Comparative Example 2, similar to FIG. 7, a discharging capacity is exhibited greater than a charging capacity, and an end point of the secondary discharging graph is located to the left as indicated by an arrow, in comparison to a start point of the secondary charging graph and an end point of the secondary discharging graph.

Accordingly, when two samples (Example 2 and Comparative Example 2) where an additive is added to the electrolytic solution are compared, the example of the present disclosure where charging/discharging is performed with a low current allows more accurate prediction of the lifespan of the secondary battery according to side reactions of the electrolytic solution, in comparison to the comparative example where charging/discharging is performed with a relatively high current.

Additionally, when FIG. 6 according to Example 1 and FIG. 8 according to Example 2 are compared, in the example of FIG. 8, the lifespan may be assessed as being more excellent, in comparison to the example of FIG. 6. For example, in FIGS. 6 and 8, when a difference of voltages of the primary charging and the secondary charging is observed based on the time point when an accumulated discharging capacity is 450 mAh, the voltage difference of FIG. 6 is 17.3 mV, and the voltage difference of FIG. 8 is 13.7 mV. In particular, when the reference value is assumed as 15.0 mV, in Example 1 of FIG. 6, the voltage difference is greater than the reference value, and thus the lifespan may be determined as an unacceptable value (e.g., bad). In Example 2 of FIG. 8, the voltage difference is less than the reference value, and thus the lifespan may be determined as good.

According to the present disclosure, it is possible to assess a lifespan of a secondary battery in a relatively accurate way within a short time. Thus, it is possible to ensure life stability of a secondary battery, which is released as a final product, by identifying batteries with a compromised lifespan in an early stage. In addition, when a battery with a compromised lifespan is identified, a problem in a process or a manufacturing facility, which adversely affects the lifespan, may be found identified and resolved. Thus, it is possible to manufacture a battery with excellent life performance.

The present disclosure has been described in detail. However, it should be understood that the detailed description and specific examples, while indicating exemplary embodiments of the disclosure, are given by way of illustration only, since various changes and modifications within the scope of the disclosure will become apparent to those skilled in the art from this detailed description.

REFERENCE NUMBERS

100: primary aging component
200: initial charging component
300: secondary aging component
400: degassing component
500: primary low-current charging component
600: primary low-current discharging component
700: life determining component

What is claimed is:

1. A method for assessing a lifespan of a secondary battery, comprising:
   primarily aging a prepared secondary battery for a predetermined time;
   initially charging the primarily aged secondary battery to a predetermined SOC;
   secondarily aging the initially charged secondary battery for a greater time duration than the primary aging;
   degassing by removing gas in the secondarily aged secondary battery;
   charging the secondary battery with a primary low-current charge at C-rate of 1/15 C or less, after the degassing step;
   discharging the secondary battery with a primary low-current discharge at C-rate of 1/15 C or less, after charging with the primary low-current; and
   determining a lifespan of the secondary battery by using a difference of voltages measured from the secondary battery at a plurality of different time points that correspond to a same accumulated capacity.

2. The method for assessing a lifespan of a secondary battery according to claim 1,
   wherein during charging with the primary low-current, the secondary battery is fully charged at C-rate of 1/15 C or less, and
   wherein during discharging with the primary low-current, the secondary battery is fully discharged at C-rate of 1/15 C or less.

3. The method for assessing a lifespan of a secondary battery according to claim 1, wherein during initial charging, the secondary battery is charged to a state of charge of 30% or less.

4. The method for assessing a lifespan of a secondary battery according to claim 1, wherein after discharging with the primary low-current and before determining the lifespan, further comprising:
   charging with a secondary low-current the primarily low-current-discharged secondary battery at C-rate of 1/15 C or less; and
   discharging with a secondary low-current of the secondary battery at C-rate of 1/15 C or less after the charging with the secondary low-current.

5. The method for assessing a lifespan of a secondary battery according to claim 4, wherein in determining the lifespan, a voltage measured during the primary low-current charging and a voltage measured during the secondary low-current charging are compared to determine a lifespan of the secondary battery.

6. The method for assessing a lifespan of a secondary battery according to claim 1, wherein the primary aging is performed for 10 hours to 14 hours, and the secondary aging is performed for 24 hours to 72 hours.

7. The method for assessing a lifespan of a secondary battery according to claim 1, wherein in determining the lifespan, the difference of voltages measured at the plurality of different time points is compared with a reference value to determine whether the secondary battery has an acceptable value.

8. An apparatus for assessing a lifespan of a secondary battery, comprising:
- a primary aging component configured to age a prepared secondary battery for a predetermined time;
- an initial charging component configured to charge the primarily aged secondary battery to a predetermined state of charge;
- a secondary aging component configured to age the initially charged secondary battery for a greater duration than the aging time by the primary aging component;
- a degassing component configured to remove gas in the secondary battery secondarily aged by the secondary aging component;
- a primary low-current charging component configured to charge the secondary battery, from which gas is removed by the degassing component, at C-rate of 1/15 C or less;
- a primary low-current discharging component configured to discharge the secondary battery primarily charged by the primary low-current charging component at C-rate 1/15 C or less; and
- a life determining component configured to determine a lifespan of the secondary battery by using a difference of voltages measured from the secondary battery at different two time points that correspond to a same accumulated capacity.

* * * * *